(12) United States Patent
Hirabayashi

(10) Patent No.: US 9,684,232 B2
(45) Date of Patent: Jun. 20, 2017

(54) GLASS SUBSTRATE FOR MASK BLANK, AND METHOD FOR PRODUCING THE SAME

(71) Applicant: Asahi Glass Company, Limited, Chiyoda-ku (JP)

(72) Inventor: Yusuke Hirabayashi, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 140 days.

(21) Appl. No.: 14/820,668

(22) Filed: Aug. 7, 2015

(65) Prior Publication Data
US 2016/0041461 A1 Feb. 11, 2016

(30) Foreign Application Priority Data
Aug. 7, 2014 (JP) .................. 2014-161488

(51) Int. Cl.
*C03C 15/00* (2006.01)
*C03C 19/00* (2006.01)
*G03F 1/22* (2012.01)
*B24B 49/04* (2006.01)
*G03F 1/60* (2012.01)

(52) U.S. Cl.
CPC ............... *G03F 1/22* (2013.01); *B24B 49/04* (2013.01); *C03C 15/00* (2013.01); *C03C 19/00* (2013.01); *G03F 1/60* (2013.01)

(58) Field of Classification Search
CPC ........... G03F 1/50; C03C 15/00; C03C 15/02; C03C 19/00
See application file for complete search history.

(56) References Cited

U.S. PATENT DOCUMENTS 6,855,908 B2   2/2005   Takeuchi et al.

FOREIGN PATENT DOCUMENTS

| JP | 64-40267 | 2/1989 |
| JP | 8-293483 | 11/1996 |
| JP | 2002-316835 | 10/2002 |

*Primary Examiner* — Stephen Rosasco
(74) *Attorney, Agent, or Firm* — Oblon, McClelland, Maier & Neustadt, L.L.P.

(57) ABSTRACT

A glass substrate for a mask blank has a rectangular planar shape. In four square regions each positioned at each corner of a first region (quality assurance region) and having one side of 8 mm, an angle between a least square plane in each the square region and that in the first region is 3.0 μad or less, and a PV value relative to the least square plane is 30 nm or less. In four strip regions each positioned in an area between one side of the first region and 8 mm inside the side and excluding the square regions, an angle between a least square plane in each the strip region and that in the first region is 1.5 μad or less, and a PV value relative to the least square plane is 15 nm or less.

13 Claims, 8 Drawing Sheets

GLASS SUBSTRATE FOR MASK BLANK, AND METHOD FOR PRODUCING THE SAME

CROSS-REFERENCE TO RELATED APPLICATIONS

This application claims priority from Japanese Patent Application No. 2014-161488 filed on Aug. 7, 2014, the entire subject matter of which is incorporated herein by reference.

BACKGROUND OF THE INVENTION

Technical Field

The present invention relates to a glass substrate for mask blanks for use in various kinds of lithography, and to its production method. The present invention is favorable for producing a glass substrate for mask blanks to be used in lithography using EUV (extreme ultraviolet) light (hereinafter abbreviated as "EUVL") (hereinafter this is abbreviated as "glass substrate for EUVL mask blank").

The present invention is also favorable for a glass substrate for mask blanks for use in lithography using an already-existing transmission optical system, for example, for a glass substrate for mask blanks for lithography using an ArF excimer laser or a KrF excimer laser, and for its production.

Background Art

With the recent tendency toward high-density and high-precision ultra-LSI devices, the specifications required for the surface of the glass substrate for mask blanks for use in various kinds of lithography are becoming severer year by year. In particular, with the wavelength of the light from the exposing source being shorter, the requirements for the profile accuracy of the substrate surface (flatness) and for the absence of the defects (particles, scratches, pits, etc.) in the surface are becoming severer, and a glass substrate having an extremely high flatness and having few microdefects is desired.

For example, in a case of lithography using an ArF excimer laser as the light from an exposing source, the necessary flatness of the glass substrate for mask blanks is 0.25 µm or less and the necessary defect size in the glass substrate is 0.07 µm or less; and further in a case of a glass substrate for EUVL mask blanks, the necessary flatness of the glass substrate is 0.03 µm or less as the PV value, and the necessary defect size is 0.05 µm or less.

Heretofore in producing glass substrates for mask blanks, a precision polishing method has been proposed for reducing the surface roughness (for example, see Patent Document 1).

The precision polishing method shown in Patent Document 1 is a method for final polishing using colloidal silica after polishing using an abrasive that includes cerium oxide as the main ingredient. In a case where glass substrates are polished according to the polishing method, a batch-type double side polisher in which plural glass substrates are set and both surfaces thereof are polished simultaneously is generally used.

However, in the above-mentioned precision polishing method, the limit of the flatness of the glass substrates obtainable stably is about 0.5 µm as the PV value, since the flatness is influenced by the mechanical accuracy of the carrier to hold the glass substrate, the surface plate to pinch the glass substrate, the planetary gear mechanism to drive the carrier and others.

Recently, therefore, there has been proposed a planarization method for glass substrates through plasma etching or local processing with a gas cluster ion beam (for example, see Patent Documents 2 and 3).

The planarization method shown in Patent Documents 2 and 3 is a planarization method for the surface of a glass substrate, which includes measuring the roughness profile of the surface of a glass substrate and locally processing the protrusions in the surface under the processing condition (plasma etching amount, gas cluster ion beam amount, etc.) in accordance with the protruding degree of the protrusions. In the method, with the protruding degree relative to the desired profile in each protrusion site increasing more, that is, with the processing amount in each protrusion site increasing more, the moving speed of the local processing tool must be controlled to be lower in order to increase the processing amount therein. In other words, the processing amount and the moving speed of the local processing tool are in an inverse relationship therebetween.

In a case where the flatness of the surface of a glass substrate is controlled through plasma etching or local processing with a gas cluster ion beam, the surface of the glass substrate would be roughened or an affected layer would be formed owing to the local processing, and therefore after the local processing, short-term final polishing would be necessary for improving the surface roughness and for removing the affected layer.

Patent Document 1: JP-A-64-40267
Patent Document 2: JP-A-2002-316835
Patent Document 3: JP-A-8-293483

SUMMARY OF THE INVENTION

In a case of a glass substrate for mask blanks, in particular, the area that is required to be excellent in flatness and smoothness is the quality assurance region in the substrate surface that includes the region where a mask pattern is to be formed and the region to be chucked at an exposure tool. For example, as a glass substrate for EUVL mask blanks or for mask blanks for lithography using an ArF excimer laser or a KrF excimer laser, a glass substrate of which the substrate surface size is 152 mm square is generally used, and in such a glass substrate, a typical example of the quality assurance region has a size of 142 mm square. Accordingly, it may be enough to planarize only the quality assurance region of 142 mm square of the glass substrate surface according to the above-mentioned local processing.

However, in a case of planarizing the glass substrate surface according to the above-mentioned local processing technique, the site to be processed through plasma etching or the site to be irradiated with a gas cluster ion beam must be scanned on the surface of the glass substrate. In the case of improving the flatness of the quality assurance region of 142 mm square according to the above-mentioned local processing technique, it would be favorable to scan even the region that cover the quality assurance region of 142 mm square and the outer region thereof as the site to be processed through plasma etching or the site to be irradiated with a gas cluster ion beam, rather than to scan only the quality assurance region of 142 mm square as the site to be processed through plasma etching or the site to be irradiated with a gas cluster ion beam, for more effectively improving the flatness in the quality assurance region.

In case where the surface of a glass substrate is polished according to the precision polishing method shown in Patent Document 1, the tendency of the profile would be that the center side of the substrate is relatively high and the peripheral side of the substrate would be low in the region outside the quality assurance region of 142 mm square, and the difference in height in that region would be higher than that inside the quality assurance region of 142 mm square. Owing to the influence of the profile in the region outside the quality assurance region, the tendency would be that the difference in height in the region near to the outer periphery of the quality assurance region would be, even in the region inside the quality assurance region, larger than that in the region nearer to the center area of the quality assurance region.

In case where the site to be processed through plasma etching or the site to be irradiated with a gas cluster ion beam is scanned even in the region exceeding the quality assurance region of 142 mm square, the site where the height difference is large would also be scanned as the site to be processed through plasma etching or the site to be irradiated with a gas cluster ion beam. As a result, the present inventors have found that the site adjacent to the region outside the quality assurance region of 142 mm square would be influenced by the height difference change and therefore could not attain the intended planarization. In addition, the present inventors have further found that, in the quality assurance region, the height difference change in the region nearer to the outer periphery tends to be larger than that in the region nearer to the center part of the quality assurance region.

Accordingly, for attaining the intended planarization to cover the entire area of the quality assurance region of 142 mm square, more local processing is necessary. For example, in a case of plasma etching, the area of the site to be irradiated with plasma must be reduced more, and in a case of gas cluster ion beam etching, the beam diameter must be reduced more. In these cases, the volume to be processed per unit time is reduced, and therefore a longer time would be taken for processing the entire area of the quality assurance region of 142 mm square, that is, it could not be expected to make any further improvement to the productivity.

In addition, when the height difference is large in the region near to the outer periphery of the quality assurance region, there would occur some disadvantage in the process of producing a photomask. Specifically, in a case where a light-shielding film is formed on the main surface of a glass substrate for mask blanks and where a predetermined mask pattern is formed in the light-shielding film, a resist film is formed to have a uniform thickness according to a spin coating method or the like. In such a case, however, when the height difference in the region near the outer periphery of the quality assurance region is large, then the resist film could not realize uniformity owing to the influence of that height difference. If so, it would be impossible to increase the patterning accuracy of the resist to be formed in mask patterning and, as a result, a highly-accurately patterned photomask could not be obtained. On the other hand, the area near to the outer periphery of the quality assurance region would be used as the chuck for the exposure tool, but in a case where the height difference is large in that area, the substrate profile in the region having a mask pattern formed therein would be greatly deformed during chucking owing to that influence so that the patterning accuracy would be thereby worsened.

The present invention has been made for solving the above-mentioned problems in the related art, and an object is to provide a production method for a glass substrate for mask blanks, in which a glass substrate for mask blanks excellent in flatness and smoothness in the quality assurance region in the main surface thereof and excellent in productivity is produced. Another object of the present invention is to provide the glass substrate for mask blanks excellent in flatness and smoothness in the quality assurance region in the main surface thereof and excellent in productivity.

The present invention provides a glass substrate for a mask blank, having a rectangular planar shape, wherein when a least square plane of a surface of the glass substrate for a mask blank is defined as an X-Y plane and a quality assurance region of the surface of the glass substrate for a mask blank is defined as a first region, in four strip regions each positioned in an area between one side of the first region and 8 mm inside the side of the first region and excluding areas of 8 mm from both edges in a length direction of the side of the first region, an angle between a least square plane in each the strip region and a least square plane in the first region is 1.5 μrad or less, and a PV value inside each the strip region which is relative to the least square plane in the first region is 15 nm or less, and in four square regions each positioned in the first region and contacted with each corner of the first region and having one side of 8 mm, an angle between a least square plane in each the square region and the least square plane in the first region is 3.0 μrad or less, and a PV value inside each the square region which is relative to the least square plane in the first region is 30 nm or less.

In addition, the present invention provides a method (1) for producing a glass substrate for a mask blank, comprising:

a surface profile measurement step of measuring a roughness profile in at least a first region in a surface of a glass substrate for a mask blank, where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region, a corrected distribution calculation step of giving a virtual roughness distribution that differs from an actual roughness distribution in the second region, relative to the second region, and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution in the second region obtained in the corrected distribution calculation step, wherein:

in a distance up to a half value radius in a processing profile per unit time of the local processing tool running toward a direction of the second region from a boundary between the first region and the second region, in a cross section parallel to a direction perpendicular to each side of the first region having a rectangular shape and in a cross section in a direction along an extending line from a diagonal line in the first region, the virtual roughness distribution is contained in a region between a straight line drawn by extending an inclination of the actual roughness distribution in the boundary toward a direction of the second region and a straight line drawn by extending toward the direction of the second region at an inclination of 0 from a maximum value of the actual roughness distribution in the distance up to the half value radius running toward a direction of the first region from the boundary between the first region and the second region when a straight line drawn by extending an inclination of the actual roughness distribution in the boundary toward the direction of the second region is downwardly inclined toward the second region or a minimum value of the actual roughness distribution in the distance up to the half value radius running toward the direction of the first region from the boundary between the first region and the second region when the straight line drawn by extending the inclination of the actual roughness distribution in the boundary toward the direction of the second region is upwardly inclined toward the second region.

In addition, the present invention provides a method (2) for producing a glass substrate for a mask blank, comprising:

a surface profile measurement step of measuring a roughness profile in at least a first region in a surface of a glass substrate for a mask blank, where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region, a corrected distribution calculation step of giving a virtual roughness distribution that differs from an actual roughness distribution in the second region, relative to the second region, and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution in the second region obtained in the corrected distribution calculation step, wherein:

in a distance up to a half value radius in a processing profile per unit time of the local processing tool, running toward a direction of the second region from a boundary between the first region and the second region, in a cross section parallel to a direction perpendicular to each side of the first region having a rectangular shape and in a cross section in a direction along an extending line from a diagonal line in the first region, the virtual roughness distribution is contained in a region between a straight line drawn by extending the actual roughness distribution in the boundary between the first region and the second region toward the direction of the second region at an inclination of 0, and a straight line drawn by extending an inclination of the actual roughness distribution in the boundary toward the direction of the second direction.

In addition, the present invention provides a method (3) for producing a glass substrate for a mask blank, comprising:

a surface profile measurement step of measuring a roughness profile in at least a first region in a surface of a glass substrate for a mask blank where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region, a corrected distribution calculation step of giving a virtual roughness distribution that differs from an actual roughness distribution in the second region, relative to the second region, and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution obtained in the corrected distribution calculation step, wherein:

the virtual roughness distribution is given through point-symmetric movement of the actual roughness distribution in the first region in a distance up to a half value radius in a processing profile per unit time of the local processing tool, running toward a direction of the first region from a boundary between the first region and the second region in a cross section parallel to a direction perpendicular to each side of the first region having a rectangular shape and in a cross section in a direction along an extending line from a diagonal line in the first region, in the second region around the boundary as a symmetry center.

In the method for producing a glass substrate for a mask blank according to the above (1) to (3), it is preferred that the local processing tool uses, as a processing method, at least one selected from the group consisting of an ion beam etching method, a gas cluster ion beam (GCIB) etching method, a plasma etching method, a wet etching method, a polishing method using a magnetic fluid, and a polishing method using a rotary small-size processing tool.

In the method for producing a glass substrate for a mask blank according to the above (1) to (3), it is preferred that the glass substrate for a mask blank before subjected to the surface profile measurement step is pre-polished so that a flatness (PV value) in at least the first region in the surface of the glass substrate for a mask blank is 0.5 µm or less.

According to the method in the present invention, it is possible to shorten the time to be taken in producing a glass substrate for mask blanks excellent in flatness and smoothness in the quality assurance region in the main surface thereof.

DETAILED DESCRIPTION OF THE INVENTION

The present invention is described below with reference to the drawings.

Figure 1:
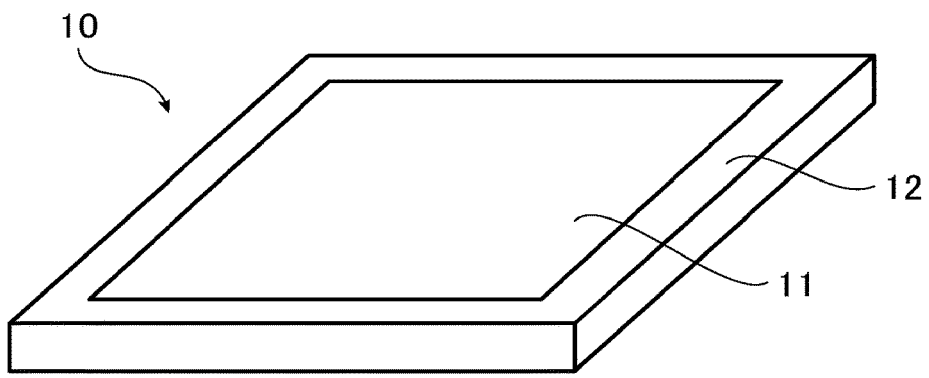
FIG. 1 is a perspective view of a glass substrate for mask blanks.

FIG. 1 is a perspective view of a glass substrate for mask blanks. As shown in FIG. 1, the glass substrate 10 for mask blanks generally has a rectangular planar shape. In the glass substrate for mask blanks, the entire main surface of the glass substrate is not always used for mask patterning and chucking to an exposing device. For example, in a case of a glass substrate for mask blanks having a size of 152 mm square, the quality assurance region for the flatness is a region of 142 mm square, and the quality assurance region is used for mask patterning and for chucking to an exposure tool. Accordingly, of the surface of the glass substrate for mask blanks, the area that is required to have a surface excellent in flatness and smoothness is the quality assurance region 11, and the region 12 outside the quality assurance region is not always required to be a surface excellent in flatness and smoothness.

The above is to exemplify a case of a typical quality assurance region (142 mm square) in an EUV mask or a mask for lithography using an ArF excimer laser or an KrF excimer laser, but depending on the kind of the photomask to be employed, the quality assurance region may differ.

As described above, in a case where the quality assurance region 11 in the surface of a glass substrate for mask blanks is planarized according to local processing such as plasma etching or gas cluster ion beam (GCIB) etching, it is said to be favorable that the site to be plasma-etched or the site to be irradiated with a gas cluster ion beam is scanned even to the outside area 12 over the quality assurance region 11 rather than a case where the site to be plasma-etched or the site to be irradiated with a gas cluster ion beam is scanned only in the quality assurance region 11, for further improving the flatness of the quality assurance region 11.

Figure 2:
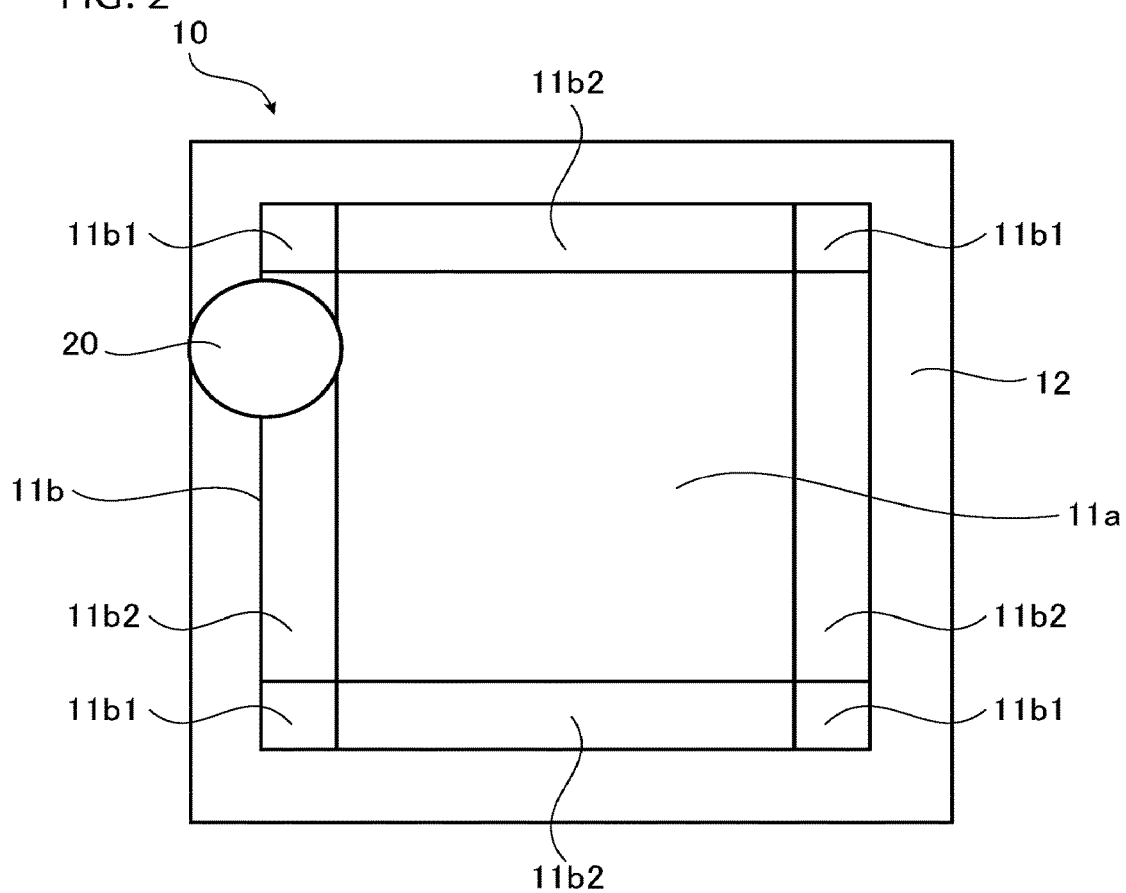
FIG. 2 is a plan view of a glass substrate for mask blanks, showing a relationship thereof to the beam diameter of GCIB as one example of a local processing tool.

However, in the quality assurance region 11, the area adjacent to the outer region 12 is influenced by the surface profile of the outer region 12 itself. FIG. 2 is a view for explaining this point. FIG. 2 is a plan view of the glass substrate 10 for mask blanks, showing a relationship thereof to the irradiation site 20 with GCIB as one example of a local processing tool. As shown in FIG. 2, in the quality assurance region 11, the inner site 11a could receive the action of the local processing through GCIB etching with no problem, but in the site 11b adjacent to the outer region 12, the GCIB irradiation site 20 may include both the site 11b and the outer region 12. In this case, the action of the local processing through GCIB etching would be influenced by the surface profile of the outer region 12, and the intended planarization could not be attained as the case may be.

Even in a case where the inside area of the quality assurance region 11 has such a recessed profile that the height of the center part of that region is relatively lower than the height of the peripheral area of the region, or even in a case where the inside area of the quality assurance region 11 has such as protruding profile that the height of the center part of the region is relatively higher than the height of the peripheral area of the region, the outer region 12 tends to be relatively high in the center side of the substrate and relatively low in the peripheral side of the substrate. With that, the degree of the height difference change in the outer region 12 is large as compared with the height difference change inside the quality assurance region 11, and in the site 11b, therefore, the local processing amount is to be low. As a result, in a case where the quality assurance region 11 has a recessed profile as the substrate profile before local polishing, the peripheral area of the substrate is naturally high as compared with the center area thereof and, in addition thereto, the local processing amount in the area is low, and consequently, in the site 11b, the substrate height profile would be such that the center part of the substrate may rapidly heighten toward the peripheral area of the substrate. In a case where the site 11b has such a height profile, there may often occur some troubles in chucking. Specifically, the entire region of the quality assurance region 11 greatly deforms to be a protruding profile since the chucking part tends to be parallel, and therefore the patterning accuracy would be lost. On the other hand, in a case where the quality assurance region 11 has a protruding profile, the substrate profile before local polishing where the peripheral area of the substrate is low cancels the insufficiency in the local processing amount in the peripheral area of the substrate, and therefore in the case, the site 11b may have a local protruding profile that has a mountain top inside the site 11b. In the case of the profile of the site 11b, there may often occur some troubles especially in point of the resist film thickness. Specifically, in a step of coating with a resist, the resist film thickness may be high in the area around the mountain top of the site 11b in which the curvature may increase, and therefore a highly-accurate pattern could not be realized owing to the reduction in the exposure accuracy.

The matter as to whether or not some chuck troubles may occur could be determined by the degree of inclination of the site 11b relative to the entire quality assurance region 11. Specifically, it is enough to determine the angle between the least square plane of the entire quality assurance region 11 and the least square plane of the site 11b. The site 11b has a frame-like shape, and the shape is nearly symmetrical relative to the center of the substrate. Accordingly, it is necessary to divide the site 11b into the following eight sections and to determine and evaluate the least square plane of each section, but not to determine the least square plane of the entire site 11b. The eight sections are namely positioned at the corner of the above-mentioned frame-like shape and among the site 11b, four square sections 11b1 of which one side corresponds to the width of the frame-like shape and four strip sections (rectangular sections) 11b2 to remain after removal of the above-mentioned four square sections from the above-mentioned frame-like shape. The matter as to whether or not any troubles with resist may occur could be determined by the size of the curvature of the site 11b. In a case where the height difference inside the frame-like shape is small relative to the width of the above-mentioned frame-like shape, the curvature of the site 11b is proportional to the PV value of the site 11b relative to the least square plane of the site 11b, and therefore it would be enough to determine the PV value of the site 11b. The least square plane of the site 11b is divided into the above eight sections (the four square sections 11b1 and the four strip sections 11b2) and is calculated separated in each site, and therefore eight PV values corresponding to those eight sections (the four square sections 11b1 and the four strip sections 11b2) are to be calculated individually. In the site 11b, when the width of the above-mentioned frame-like shape is enlarged, then the rapid height change around the outer periphery of the quality assurance region 11 could not be properly evaluated but, on the other hand, when the width of the above-mentioned frame-like shape is shortened, then the mountain top having a large curvature would overstep out of the site 11b of the evaluation region. For these reasons, the width of the above-mentioned frame-like shape is preferably 8 mm in evaluation.

As in the above, when the width of the site 11b is 8 mm and the site 11b is divided into eight sections, that is, when the site is divided into the four square sections 11b1 each positioned at the corner of the quality assurance region 11, and the four strip sections (rectangular sections) 11b2 between the two corners, then the relationship between those eight sections (the four square sections 11b1 and the four strip sections 11b2) and the quality assurance region 11 is preferably determined as described below.

First, the least square plane in the quality assurance region 11, and the least square plane of each of the above-mentioned eight sections (the four square sections 11b1 and the four strip sections 11b2) are determined. Then, the angle between the least square plane in the quality assurance region 11 and the least square plane in each of the eight sections (the four square sections 11b1 and the four strip sections 11b2), totaling eight values of the angle, is calculated. Further, the PV value relative to the least square plane in each of the eight sections (the four square sections 11b1 and the four strip sections 11b2) is calculated.

In this step, the angle between the least square plane in the quality assurance region 11 and the least square plane in each of the four strip sections (rectangular sections) 11b2 may be good to be 1.5 μrad or less each, and is preferably 1.0 μrad or less, more preferably 0.5 μrad or less. The PV value of each strip section (rectangular section) 11b2 relative to the least square plane in those four strip sections (rectangular sections) 11b2 may be good to be 15 nm or less each, and is preferably 12 nm or less, more preferably 10 nm or less.

Further, the angle between the least square plane in the quality assurance region 11 and the least square plane in each of the four square sections 11b1 may be good to be 3.0 μrad or less each, and is preferably 2.0 μrad or less, more preferably 1.0 μrad or less. The PV value of each square section 11b1 relative to the least square plane in those four square sections 11b1 may be good to be 30 nm or less each, and is preferably 25 nm or less, more preferably 20 nm or less. Since the area of the square section 11b1 is smaller than the area of the strip section (rectangular section) 11b2, the influence of the former on substrate deformation in chucking could be small. Further, since the mountain top of the local protrusion profile of the square section 11b1 is remoter from the patterning region than that of the strip section (rectangular section) 11b2, the influence of the resist film thickness change around the mountain top of the former on the patterning could be small. For these reasons, the requirements for the square section 11b1 relative to the angle and the PV value can be relaxed as compared with those for the strip section (rectangular section) 11b2.

The glass substrate in which the angle and PV value satisfy the above-mentioned ranges is free from patterning accuracy degradation depending on the resist film thickness distribution around the periphery of the substrate, and is therefore free from patterning accuracy degradation during photoexposure owing to the substrate deformation in chucking, and consequently, the glass substrate is favorable for mask blanks for use for EUVL or for ArF lithography or KrF lithography in which highly-accurate patterning is required.

In the present invention, the least square plane in the surface of the glass substrate 10 for mask blanks having a rectangular planar shape is referred to as an X-Y plane, the first region 11 in the quality assurance region of the surface of the glass substrate for mask blanks is referred to as a region 11, and the region outside the first region 11 by at least 2 mm therefrom is referred to as a second region 12, and the glass substrate 10 is processed according to the following steps. In the second region 12, the four corner regions may be referred to as third regions. The third region constitutes a part of the second region 12, but for specifically defining the region if desired, the region may be referred to as the third region in the following description.

Here, the reason why the least square plane of the surface of the glass substrate 10 for mask blanks is referred to as an X-Y plane is because the surface of the glass substrate 10 for mask blanks has minor recesses and protrusions, and is not strictly plane. The reason why the region outside the first region 11 of the quality assurance region by at least 2 mm from that region is referred to as a second region 12 is as follows.

Figure 3:
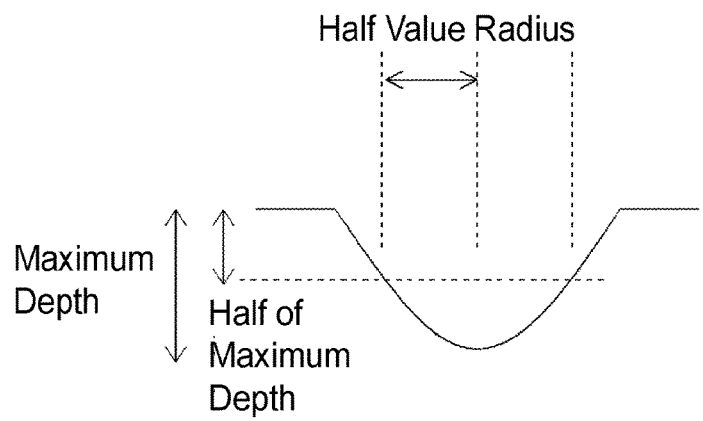
FIG. 3 is a view for explaining a processing profile in local processing, and the half value radius in processing profile per unit time of a local processing tool.

The processing profile for the local processing is, as shown in FIG. 3, a profile similar to a bell-shaped normal distribution in which, in general, the processing speed is higher in the area nearer to the center and the processing speed is slower in the area nearer to the outer periphery. In a case where a profile component with a period of a space wavelength λ of 10 mm or more is planarized through local processing, a processing profile having a shape similar to a normal distribution with a standard deviation of 2 mm may be employed. In this case, the processing amount on the outside of one side 1σ of the normal distribution is 16% of the processing amount of the entire processing profile in local processing, and therefore in a case where the center of the local processing tool is outside the region 1 by 2 mm or more therefrom, the influence of the region 1 on the shape after the processing would be small. In consideration of these points, the second region 12 here is the region that is outside the first region 11 by at least 2 mm therefrom.

The half value radius in the processing profile per the unit time of the local processing tool to be mentioned below indicates, as shown in FIG. 3, the width corresponding to the half depth of the maximum depth of the processing profile in carrying out the local processing for a suitable period of time at a predetermined position.

[Surface Profile Measurement Step]

In this step, the roughness profile in at least the first region of the surface of the glass substrate for mask blank is measured. This step gives the actual roughness distribution in the first region.

In this step, for measuring the roughness profile in the surface of the glass substrate for mask blanks, a laser interferometer, a laser displacement meter, an ultrasonic displacement meter, a contact displacement meter, etc. are usable. In particular, for the reason that the entire main surface of the glass substrate for mask blanks can be measured all at once in a noncontact mode, the laser interferometer is preferred.

[Corrected Distribution Calculation Step]

Figure 4:
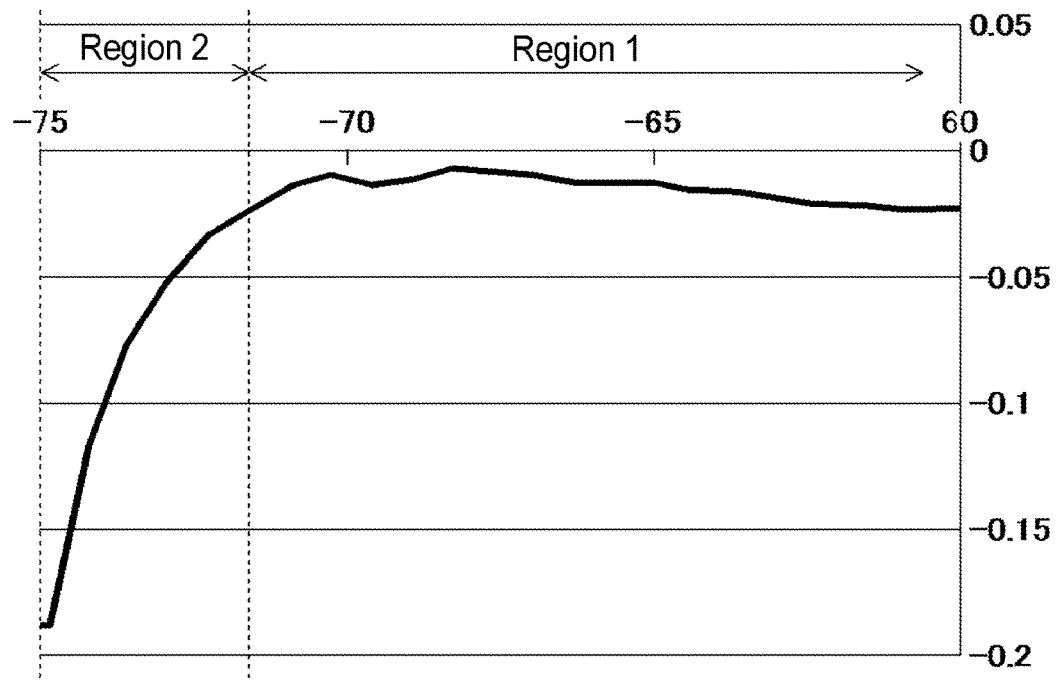
FIG. 4 is a view showing one example of an actual roughness distribution of a first region and a second region of a glass substrate for mask blanks.

FIG. 4 is a view showing one example of an actual roughness distribution in a first region (region 1) and a second region (region 2) of a glass substrate for mask blanks, in which the right-handed end is the position of the inside of the substrate (inside the quality assurance region), and this shows a profile of an actual roughness distribution to get nearer to the outer periphery of the substrate toward the left-handed end of the drawing. The actual roughness distribution in FIG. 4 is a case of an actual roughness distribution in a cross section parallel to the direction perpendicular to each side of the above-mentioned X-Y (that is, X-axis or Y-axis).

In FIG. 4, the roughness distribution, that is, the height difference is larger in the second region (region 2) than in the first region (region 1). Here, in the second region (region 2), the height of the substrate surface is lower in the direction toward the outer periphery thereof.

Also in this case, the same shall apply to the four corner regions (third regions) in the second region 12 (region 2). Similarly, also in the actual roughness distribution in the cross section of the straight line running toward the third region (region 3) from the first region (region 1), the height difference in the third region (region 3) is larger than in the first region (region 1). Above all, in the actual roughness distribution in the cross section cut along the extending line from the diagonal line in the first region (region 1), the height difference in the third region (region 3) tends to be especially larger than in the first region (region 1).

In general, in production of a glass substrate for mask blanks, the surface of the glass substrate is pre-polished at a relatively high processing rate until the pre-polished surface could have a predetermined flatness and a predetermined surface roughness prior to the process of processing the glass substrate with a local processing tool for GCIB etching. For the pre-polishing, a two-side polishing machine is generally used. In a case where the surface of a glass substrate is polished with a two-side polishing machine, the surface of the substrate tends to be low toward the outer periphery of the glass substrate, as shown in FIG. 4.

Figure 5:
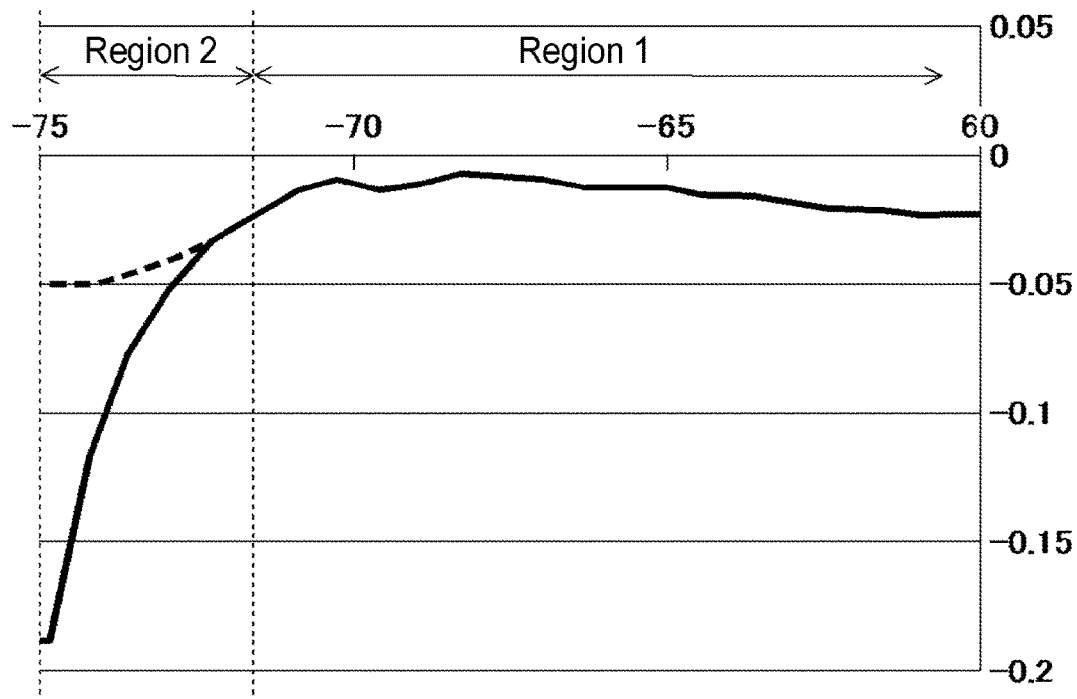
FIG. 5 is a view showing one example of virtual roughness distribution presetting in a second region of a glass substrate for mask blanks.

This step gives, as a roughness distribution in the second region, a virtual roughness distribution that differs from the actual roughness distribution in the second region. FIG. 5 is a view showing one example of virtual roughness distribution presetting in the second region (region 2) of a glass substrate for mask blanks. In FIG. 5, the actual roughness distribution in the first region (region 1) and the second region (region 2) shown in FIG. 4 is shown by the solid line therein, and the virtual roughness distribution in the second region (region 2) is by the dashed line. As obvious from the drawing, by presetting the virtual roughness distribution, the roughness distribution in the second region (region 2) is so corrected as to get close to the actual roughness distribution in the first region (region 1) at the boundary between the first region (region 1) and the second region (region 2).

As described with reference to FIG. 2, in processing with a local processing tool like in GCIB etching, the site adjacent to the outer region 12 of the quality assurance region 11 is influenced by the surface profile in the outer region 12, that is, by the roughness distribution in the outer region 12.

However, by presetting such virtual roughness distribution as the roughness distribution in the second region, in processing with a local processing tool, the influence of the surface profile in the second region 12 could be reduced.

Next shown hereinunder is a presetting process for the virtual roughness distribution in the second region.

Figure 6:
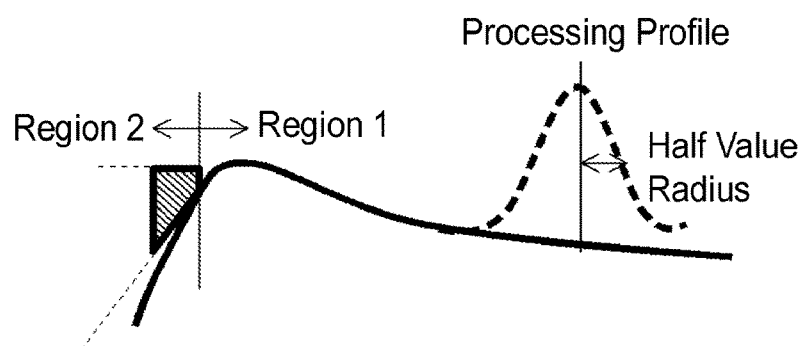
FIG. 6 is a view showing one example of a presetting process for a virtual roughness distribution in a second region.

FIG. 6 is a view showing one example of a presetting process for the virtual roughness distribution in the second region (region 2).

In FIG. 6, the determining method of the range in which the virtual roughness distribution in the second region (region 2) is existed is different between the case where the straight line (in FIG. 6, the dashed line extending in the oblique direction in FIG. 6) drawn by extending the inclination of the actual roughness distribution in the first region (region 1) in the boundary toward the direction of the second region is downwardly inclined toward the second region (region 2) and the case where the straight line is upwardly inclined toward the second region.

Specifically, in FIG. 6, in a distance up to a half value radius in a processing profile per unit time of the local processing tool running toward the direction of the second region (region 2) from the boundary between the first region (region 1) and the second region (region 2), when the straight line (in FIG. 6, dashed line extending in the oblique direction) drawn by extending the inclination of the actual roughness distribution in the first region (region 1) in the boundary toward the direction of the second region is downwardly inclined toward the second region (region 2), the virtual roughness distribution in the second region (region 2) exists in the region (in FIG. 6, the shadowed region) between the straight line (in FIG. 6, the dashed line extending in the oblique direction) drawn by extending the inclination of the actual roughness distribution in the first region (region 1) in the boundary toward the second region direction and the straight line (in FIG. 6, the dashed line extending in the horizontal direction) drawn by extending toward the direction of the second region (region 2) at an inclination of 0 from the maximum value of the actual roughness distribution in the first region (region 1) in the distance up to the half value radius running toward the first region direction from the boundary between the first region (region 1) and the second region (region 2).

On the other hand, when the straight line (in FIG. 6, the dashed line extending in the oblique direction) drawn by extending the inclination of the actual roughness distribution in the boundary toward the direction of the second region is upwardly inclined toward the second region, the virtual roughness distribution in the second region (region 2) exists in the region (in FIG. 6, the shadowed region) between the straight line (in FIG. 6, the dashed line extending in the oblique direction) drawn by extending the inclination of the actual roughness distribution in the first region (region 1) in the boundary toward the second region direction and the straight line (in FIG. 6, the dashed line extending in the horizontal direction) drawn by extending toward the direction of the second region (region 2) at an inclination of 0 from the minimum value of the actual roughness distribution in the first region (region 1) in the distance up to the half value radius running toward the first region direction from the boundary between the first region (region 1) and the second region (region 2).

Specifically, in FIG. 6, the straight line at an inclination of 0 shows a straight line drawn by extending the maximum value of the actual roughness distribution in the first region toward the direction of the second region at an inclination of 0, in a range of a width W running toward the first region direction from the boundary between the first region and the second region, where W means a half value radius (half value width). Here, "at an inclination of 0" as referred to herein means that the line is parallel on the basis of the X-Y plane, that is, on the basis of the least square plane in the quality assurance region of the surface of the glass substrate for mask blanks. Unless otherwise specifically indicated hereinunder, the basis of the height and inclination of the substrate surface profile is the least square plane in the quality assurance region in the following description.

Here, the range where the virtual roughness distribution is preset varies depending on the local processing to be used in the subsequent processing step. In the present invention, the virtual roughness distribution is preset in the range of the distance to the half value radius in the processing profile per the unit time of the local processing tool, running toward the second region (region 2) from the boundary between the first region (region 1) and the second region (region 2).

The half value radius in the processing profile per the unit time of the local processing tool is as described above.

The reason for presetting the virtual roughness distribution to fall within the above range is that the processing profile for the local processing is, as shown in FIG. 3, a profile similar to a bell-shaped normal distribution in which the processing speed is higher in the area nearer to the center and the processing speed is slower in the area nearer to the outer periphery, and therefore the processing amount in the area outside the half value radius is vanishingly small.

In FIG. 6, one straight line to form the "shadowed region" in the drawing is the straight line drawn by extending any one of the maximum value and the minimum value in the actual roughness distribution in the first region in the distance to the half value radius in the processing profile per the unit time of the local processing tool, running toward the first region direction from the boundary between the first region and the second region, in the direction to the second region at an inclination of 0. However, the present invention is not limited to this embodiment.

Figure 7:
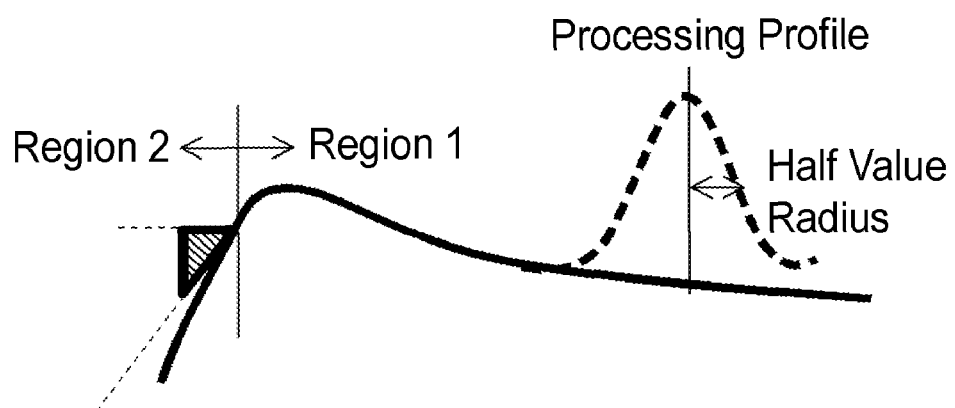
FIG. 7 is a view showing another example of a presetting process for a virtual roughness distribution in a second region.

Apart from this, as shown in FIG. 7, the virtual roughness distribution in the second region may exist in the region (in FIG. 7, the shadowed region) between the straight line drawn by extending the actual roughness distribution in the first region at the boundary between the first region and the second region, in the direction to the second region at an inclination of 0 (in FIG. 7, the dashed line extending in the horizontal direction) and the straight line drawn by extending the inclination of the actual roughness distribution in the first region at the boundary in the direction of the second region (in FIG. 7, the dashed line extending in the oblique direction).

In a case where the surface of a glass substrate is polished with a two-side polishing machine, the height of the substrate surface may increase, as the case may be, toward the outer periphery of the glass substrate, that is, toward the second region from the first region, contrary to the case shown in FIG. 4. In this case, the virtual roughness distribution in the second region exists in the region between the straight line drawn by extending from the minimum value of the actual roughness distribution in the distance toward the half value radius (half value width) W from the site adjacent to the second region among the first region, that is, from the boundary between the two regions at an inclination of 0, in the direction of the second region, and the straight line drawn by extending the inclination of the actual roughness distribution in the boundary between the first region and the second region in the direction of the second region.

As described above, in the present invention, the range for presetting the virtual roughness distribution therein falls in the distance up to the half value radius in the processing profile per the unit time of the local processing tool from the boundary between the first region and the second region. Consequently, in the above description, the actual roughness distribution in the site adjacent to the second region in the first region indicates the actual roughness distribution in the distance up to the half value radius in the processing profile per the unit time of the local processing tool, running toward the first region direction from the boundary between the first region and the second region.

Figure 8:
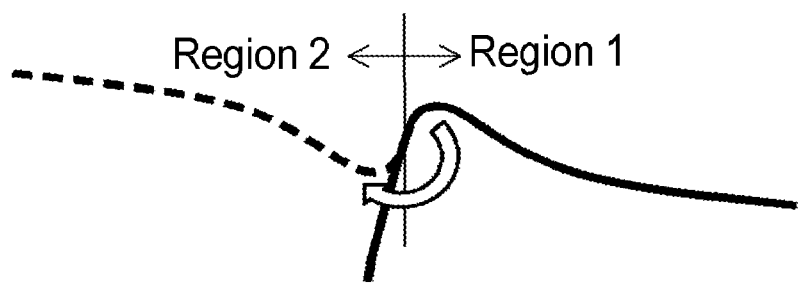
FIG. 8 is a view showing still another example of a presetting process for a virtual roughness distribution in a second region.

FIG. 8 is a view showing another example of a presetting process for the virtual roughness distribution in the second region (region 2).

In FIG. 8, the virtual roughness distribution in the second region (region 2) has a shape given through point-symmetric movement of the actual roughness distribution in the first region (region 1) around the boundary between the first region (region 1) and the second region (region 2) as the symmetric center for the movement to the second region (region 2).

As described above, in the present invention, the range where the virtual roughness distribution is to be preset covers the distance up to the half value radius in the processing profile per the unit time of the local processing tool, from the boundary between the first region (region 1) and the second region (region 2). Consequently, in the above description, the actual roughness distribution in the first region (region 1) is the actual roughness distribution in the distance up to the half value radius in the processing profile per the unit time of the local processing tool, running toward the direction of the first region (region 1) from the boundary between the first region (region 1) and the second region (region 2).

As in the above, the case described hereinabove indicates the process for presetting the virtual roughness distribution in the second region relative to the actual roughness distribution in the first region, in the cross section parallel to the direction perpendicular to each side of X-Y (that is, X-axis or Y-axis). The presetting of the virtual roughness distribution in the second region in this step applies also to the presetting of the virtual roughness distribution in the four corner regions of the second region, that is, to the presetting thereof in the third region to be described hereinunder. In this case, in addition to the cross section parallel to the direction perpendicular to the X-axis or the Y-axis, the same shall apply also to the cross section along the extending line from the diagonal line in the first region.

Figure 9:
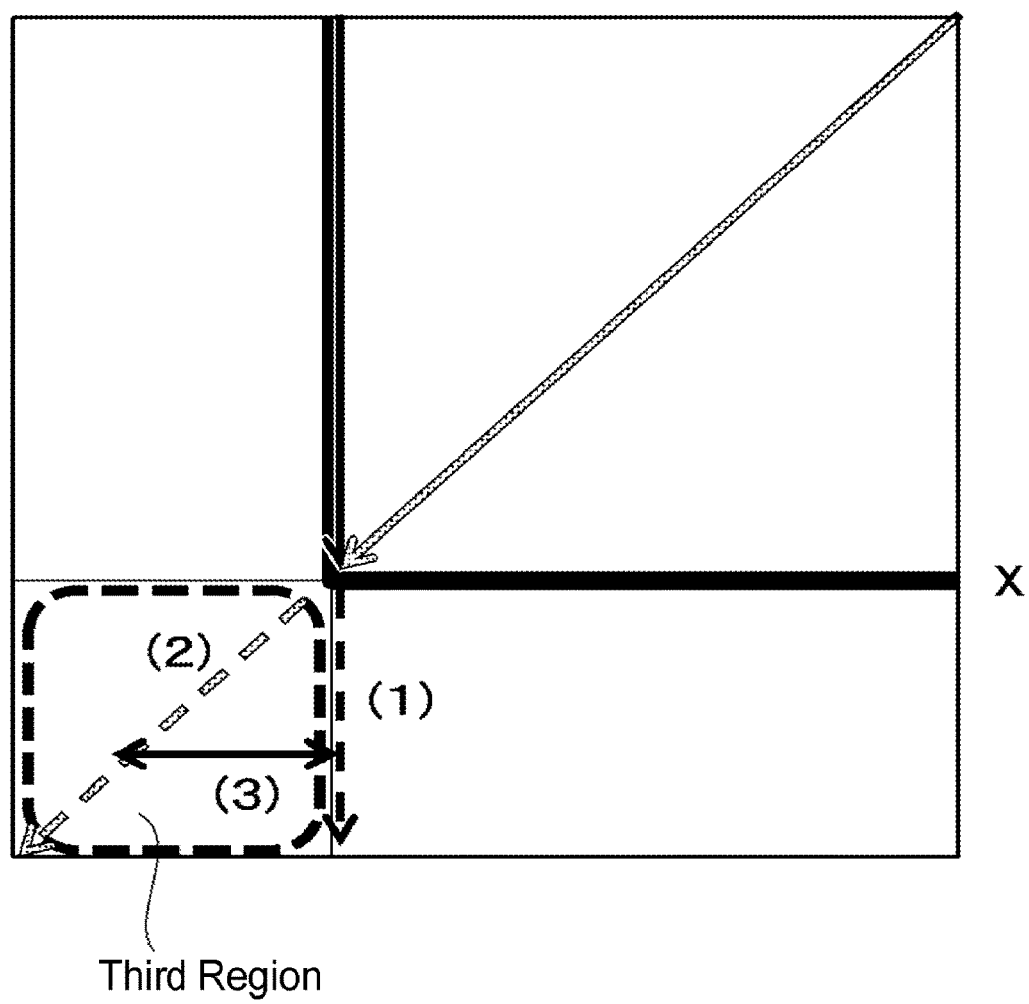
FIG. 9 is a view for explaining a presetting process for a virtual roughness distribution in a third region.

In the third region, the virtual roughness distribution is preset according to the process to be mentioned below. FIG. 9 is a view for explaining a presetting process for the virtual roughness distribution in the third region.

In FIG. 9, as shown by (1), the virtual roughness distribution (1) in the second region is preset from the actual roughness distribution in the first region in the cross section parallel to the Y-axis. Next, in FIG. 9, as shown by (2), the virtual roughness distribution (2) in the third region is preset from the actual roughness distribution in the first region, based on the cross section along the extending line from the diagonal line in the first region (diagonal line in the X-Y plane). Next, the virtual roughness distributions (1) and (2) in the third region are interpolated in the direction of the X-axis by linear interpolation or the like. Similarly, the virtual roughness distribution in the second region is preset from the actual roughness distribution in the first region in the cross section parallel to the X-axis, and the virtual roughness distribution (2) in the third region in the cross section along the extending line from the diagonal line in the first region is preset, and thereafter the virtual roughness distribution in the second region is interpolated in the direction of the Y-axis by linear interpolation or the like. In that manner, the entire third region may be given the virtual roughness distribution.

As described above, in the third region, the cross section along the extending line from the diagonal line in the first region tends to have a large height difference even in the third region, and therefore in this step, it is better to give the virtual roughness distribution also relative to the actual roughness distribution in that cross section.

[Processing Step]

In this step, the first region and the second region of the surface of the glass substrate for mask blanks are processed, using a local processing tool of which the unit processing area is smaller than the area of the first region, while controlling the processing amount based on the actual roughness distribution in the first region obtained in the surface profile measurement step and on the virtual roughness distribution in the second region obtained in the corrected distribution calculation step.

Examples of the processing method with the local processing tool for use in this step includes an ion beam etching method, a gas cluster ion beam (GCIB) etching method, a plasma etching method, a wet etching method, a polishing method using a magnetic fluid (MRF: registered trademark). As the local processing tool, a rotary small-size processing tool is also usable. In this step, at least one of the above-mentioned local processing tools may be used.

Ion beam etching, gas cluster ion beam etching and plasma etching each are a method of beam irradiation to the surface of a glass substrate. The processing amount control based on the actual roughness distribution in the first region obtained in the surface profile measurement step and on the virtual roughness distribution in the second region obtained in the corrected distribution calculation step is carried out by controlling the beam irradiation condition for the surface of a glass substrate. The processing of the first region and the second region in the surface of a glass substrate for mask blanks is carried out by scanning a beam on the glass substrate for mask blanks. As a method of beam scanning, there are known luster scanning and spiral scanning, and any of these is employable here.

Of the methods for beam irradiation to the surface of a glass substrate for mask blanks mentioned above, use of gas cluster ion beam etching is preferred as it is capable of processing the surface into one having a small surface roughness and excellent in smoothness. In this description, the surface roughness is the root-mean-square roughness Rq (formerly RMS) based on JIS-B0601.

Gas cluster ion beam etching is a method in which a reactive substance (source gas) that is gaseous at room temperature and under normal pressure is injected under pressure into a vacuum chamber via an expansion nozzle to form a gas cluster, then this is ionized through electronic irradiation, the resultant gas cluster ion beam is irradiated to the object, and the object is thereby etched. The gas cluster is generally composed of a massive cluster of atoms or molecules that includes thousands of atoms or molecules. In the finish processing method in the present invention using such gas cluster ion beam etching, when the gas cluster collides against the surface of a glass substrate, the multi-body impact effect is generated by the interaction with the solid and the surface of the glass substrate is thereby processed.

In the case of using gas cluster ion beam etching, as the source gas, examples thereof include any gas of $SF_6$, Ar, $O_2$, $N_2$, $NF_3$, $N_2O$, $CHF_3$, $CF_4$, $C_2F_6$, $C_3F_8$, $C_4F_6$, $SiF_4$, $COF_2$ or the like, either alone or as combined. Of those, $SF_6$ and $NF_3$ are excellent as the source gas in point of the chemical reaction to occur when the gas colloids against the surface of a glass substrate, and therefore, preferred here is use of a mixed gas containing $SF_6$ or $NF_3$, concretely a mixed gas of $SF_6$ and $O_2$, a mixed gas of $SF_6$, Ar and $O_2$, a mixed gas of $NF_3$ and $O_2$, a mixed gas of $NF_3$, Ar and $O_2$, a mixed gas of $NF_3$ and $N_2$, or a mixed gas of $NF_3$, Ar and $N_2$. In these mixed gases, the preferred blending ratio of the constitutive components may vary depending on the conditions for the gases, such as the irradiation condition or the like. The preferred blending ratio of the gases is mentioned below.

$SF_6/O_2$=(0.1 to 5%)/(95 to 99.9%) (mixed gas of $SF_6$ and $O_2$).

$SF_6/Ar/O_2$=(0.1 to 5%)/(9.9 to 49.9%)/(50 to 90%) (mixed gas of $SF_6$, Ar and $O_2$).

$NF_3/O_2$=(0.1 to 5%)/(95 to 99.9%) (mixed gas of $NF_3$ and $O_2$).

$NF_3/Ar/O_2$=(0.1 to 5%)/(9.9 to 49.9%)/(50 to 90%) (mixed gas of $NF_3$, Ar and $O_2$).

$NF_3/N_2$=(0.1 to 5%)/(95 to 99.9%) (mixed gas of $NF_3$ and $N_2$).

$NF_3/Ar/N_2$=(0.1 to 5%)/(9.9 to 49.9%)/(50 to 90%) (mixed gas of $NF_3$, Ar and $N_2$).

Of those mixed gases, preferred is a mixed gas of $NF_3$ and $N_2$, a mixed gas of $SF_6$ and $O_2$, a mixed gas of $SF_6$, Ar and $O_2$, a mixed gas of $NF_3$ and $O_2$, or a mixed gas of $NF_3$, Ar and $O_2$.

The irradiation conditions including the cluster size, the ionization current to be applied to the ionization electrode in the gas cluster ion beam etching apparatus for ionization, the accelerating voltage to be applied to the accelerating electrode in the gas cluster ion beam etching apparatus, and the dose of the gas cluster ion beam may be suitably selected in accordance with the kind of the source gas and the surface profile of the glass substrate after pre-polishing. For example, for improving the flatness by removing the waviness from the surface of the glass substrate for mask blanks without too much worsening the surface roughness of the glass substrate for mask blanks, the accelerating voltage to be applied to the accelerating electrode is preferably from 15 to 30 kV.

The polishing method with a magnetic fluid (MRF: registered trademark) is a method of polishing the site to be polished of the object, using a magnetic fluid containing abrasive particles, and is described in, for example, JP-A-2010-82746 and Japanese Patent No. 4761901. The polishing apparatus using the MRF (registered trademark) polishing method and the polishing procedure for the polishing apparatus are exemplified in JP-A-2010-82746.

According to the MRF (registered trademark) method, the site to be polished of an object is pressed into a magnetic fluid and the magnetic fluid kept in contact with the site to be polished scrapes away the protrusions in the site to be polished. Consequently, in at least the first polishing in the case using the polishing apparatus 10 shown in FIG. 1 in JP-A-2010-82746, it is desirable that the site 51 to be polished is kept pressed into the depth of 20% or more of the maximum height of the magnetic fluid 30 put in the circumferential periphery 111. More preferably, the site is kept pressed into the depth of 30% or more. It is desirable that the object is polished in such a manner that the site 51 to be polished thereof is kept pressed into the depth of 50% or less of the maximum height of the magnetic fluid 30 put on the circumferential periphery 111.

The magnetic fluid in the MRF (registered trademark) polishing method is a fluid of a non-colloidal magnetic substance dispersed in a carrier. When the fluid is kept in a magnetic field, its rheological properties (viscosity, elasticity, and plasticity) change. The specific composition of the fluid may be suitably defined in accordance with a conventional technique.

The magnetic fluid preferably has a viscosity coefficient of preferably $30.0 \times 10^{-3}$ Pa·s or more, more preferably $35.0 \times 10^{-3}$ Pa·s or more, most preferably $40.0 \times 10^{-3}$ Pa·s or more. The viscosity coefficient as referred to herein indicates the coefficient of viscosity of the magnetic fluid kept in a non-magnetic field (in an atmosphere not positively generating a magnetic field). When the viscosity coefficient of the magnetic fluid falls within the above range, in general, the maximum height of the magnetic fluid put on the circumferential periphery of a wheel is from 1.0 mm to 2.0 mm.

On the other hand, the magnetic fluid preferably has a viscosity coefficient of $70.0 \times 10^{-3}$ Pa·s or less, more preferably $65.0 \times 10^{-3}$ Pa·s or less.

As described above, the magnetic fluid to be used in the MRF (registered trademark) polishing method includes abrasive particles. The abrasive particles preferably has a mean particle size of preferably 30 µm or less, more preferably 20 µm or less and most preferably 15 µm or less, from the viewpoint that the abrasive of the kind can readily reduce the surface roughness of the polished surface of the object to a desired value or less.

On the other hand, when the mean particle size of the abrasive particles is too small, the polishing efficiency would worsen. Consequently, the mean particle size of the abrasive particles is preferably 0.5 µm or more, more preferably 3.0 µm or more, most preferably 5.0 µm or more.

The abrasive grains may include one or more known materials such as silica, cerium oxide, diamond and the like. From the viewpoint of improving the polishing efficiency, the abrasive grains include one or more kinds selected from the group consisting of cerium oxide and diamond. Concretely, diamond paste (D-20, D-10, etc., manufactured by QED Technologies) and cerium oxide (C-20, C-10, etc., manufactured by QED Technologies) are usable. In particular, from the viewpoint of readily reducing the surface roughness to a desired value or less, it is more desirable that the abrasive particles include cerium oxide.

The processing method using a rotary small-size processing tool is a method where the polishing site that rotates by a motor is brought into contact with the part to be polished of the object so as to polish the part of the object.

The rotary small-size processing tool may be any one in which the polishing site is a rotor capable of polishing an object, including, for example, a system where a small-size surface plate is pressed against the substrate to be polished, just vertically from the top thereof and the surface plate is thus rotated around the axis vertical to the substrate surface under pressure, and a system where a rotary processing tool fixed to a small-size grinder is pressed against the object to be polished in the oblique direction thereto.

In processing with such a rotary small-size processing tool, the area of the tool to be kept in contact with the site to be polished therewith is important, and the contact area is preferably from 1 to 500 mm², more preferably from 50 to 300 mm².

In processing with the rotary small-size processing tool, the rotation number of the polishing site is also important, and the rotation number of the polishing site is preferably from 50 to 2,000 rpm, more preferably from 100 to 1,800 rpm, even more preferably from 200 to 1,600 rpm.

In processing with the rotary small-size processing tool, the pressure thereof in contact with the site to be processed is also important, and the pressure is preferably from 1 to 30 gram-weight/mm², more preferably from 2 to 16 gram-weight/mm².

In processing with the rotary small-size processing tool, preferably, the object is processed while the polishing abrasive slurry is kept between the tool and the object to be polished therewith. As the abrasive particles, examples thereof include silica, cerium oxide, alundum, white alundum (WA), FO, zirconia, SiC, diamond, titania, germania, etc. Of those, cerium oxide is preferred from the viewpoint of the ability thereof to readily reduce the surface roughness to a desired value or less.

The local processing tool to be used in the processing step may be one in which the processing area is smaller than the area of the first region. However, the processing area in the local processing tool is preferably 450 mm² or less from the viewpoint of the ability thereof to correct the profile component contributing toward the flatness, more preferably 120 mm² or less.

On the other hand, the processing area in the local processing tool is preferably 30 mm² or more for increasing the productivity with preventing the processing damage, even more preferably 50 mm² or more.

The production method for a glass substrate for mask blanks in the present invention is described further hereinunder.

[Glass Substrate]

The glass to constitute the glass substrate for mask blanks to be produced according to the method of the present invention preferably has a small coefficient of thermal expansion, and also preferably, the fluctuation of the coefficient of thermal expansion thereof is small. Concretely, preferred is low-thermal expansion glass having a coefficient of thermal expansion at 20° C. of 0±30 ppb/° C., more preferred is ultra-low-thermal expansion glass having a coefficient of thermal expansion at 20° C. of 0±10 ppb/° C., and even more preferred is ultra-low-thermal expansion glass having a coefficient of thermal expansion at 20° C. of 0±5 ppb/° C.

As the above-mentioned low-thermal expansion glass and ultra-low-thermal expansion glass, glass mainly including $SiO_2$, typically quartz glass is usable. Concretely, examples thereof include synthetic quartz glass mainly including $SiO_2$ and containing $TiO_2$ in an amount of from 1 to 12% by mass, and AZ (Zero-expansion glass manufactured by Asahi Glass Company, Ltd.). The glass substrate may be polished generally as a tabular quadrilateral, but the shape is not limited thereto.

In general, in the glass substrate polishing step, the substrate is pre-polished in plural times, and then finally polished. During the pre-polishing, the glass substrate is roughly polished to have a predetermined thickness, then polished at the end face and chamfered, and further, the substrate surface is pre-polished so that the surface roughness and the flatness thereof could be not more than a predetermined value. The pre-polishing is carried out plural times, for example, two or three times. A conventional method may be employed for the pre-polishing. For example, plural two-side lapping devices are connected in series, and a glass substrate is sequentially polished in the polishing apparatus while the abrasive to be used and the polishing condition are changed, whereby the surface of the glass substrate is pre-polished so as to have a predetermined surface roughness or a predetermined flatness.

Also in the present invention, it is desirable that the surface of the glass substrate for mask blanks is pre-polished before the surface profile measurement step. More concretely, it is desirable that the glass substrate for mask blanks is, before the surface profile measurement step, pre-polished so that the flatness (PV value) of the first region of the glass substrate before the step could be 1 µm or less.

EXAMPLES

The following Examples are to demonstrate the process mentioned below.

(1) The roughness profile of the main surface of a glass substrate for mask blanks having a size of 152 mm square, which has been pre-polished, is measured using a laser interferometer to measure the actual roughness distribution in the first region (region of 142 mm square) thereof. In Examples 1-1, 1-2, 1-3, 1-4 and Comparative Examples 1-1, the same glass substrate for mask blanks is processed; in Examples 2-1, 2-2, 2-3, 2-4 and Comparative Example 2-1, the same glass substrate for mask blanks is processed; in Examples 3-1, 3-2, 3-3, 3-4 and Comparative Example 3-1, the same glass substrate for mask blanks is processed; and in Examples 4-1, 4-2, 4-3, 4-4 and Comparative Example 4-1, the same glass substrate for mask blanks is processed.

(2) A virtual roughness distribution is preset in the second region 2 mm outside the first region. In Examples 1-1, 2-1, 3-1 and 4-1, the straight line drawn by extending the actual roughness distribution in the boundary between the first region and the second region, as obtained in (1), in the direction of the second region at an inclination of 0 is the virtual roughness distribution in the second region. As described below, the half value radius in the processing profile is 2.8 mm. In Examples 1-2, 2-2, 3-2 and 4-2, the straight line drawn by extending the inclination of the actual roughness distribution in the boundary between the first region and the second region, as obtained in (1), is the virtual roughness distribution in the second region. In Examples 1-3, 2-3, 3-3 and 4-3, the line drawn by extending the secondary curve of which the height and the inclination are the same as those of the actual roughness distribution in the boundary between the first region and the second region, as obtained in (1), in the direction of the second region, concretely, the secondary curve of which the height and the inclination are the same as those of the actual roughness distribution in the boundary between the first region and the second region and of which the inclination becomes 0 at the position of 17 mm moving on the second region side from the boundary between the first region and the second region is the virtual roughness distribution in the second region. In Examples 1-4, 2-4, 3-4 and 4-4, the profile given through point-symmetric movement of the actual roughness distribution in the boundary between the first region and the second region, as obtained in (1), to the second region around the boundary serving as the symmetric center is the virtual roughness distribution in the second region. In Comparative Examples 1-1, 2-1, 3-1 and 4-1, the virtual roughness distribution in the second region is not preset, and the actual roughness distribution in the second region measured in the step of (1) is used directly as it is.

Figure 10:
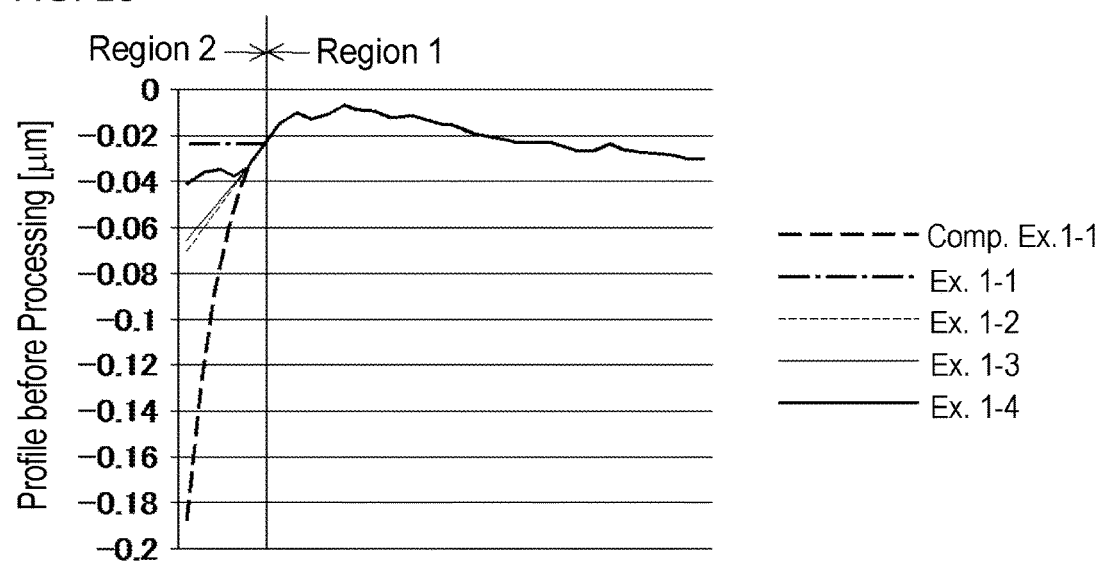
FIG. 10 is a view showing a relationship between an actual roughness distribution in a first region of a glass substrate for mask blanks and a virtual roughness distribution in a second region thereof in Examples 1-1 to 1-4 and Comparative Example 1-1 (in Comparative Example 1-1, the latter distribution is an actual roughness distribution in a second region).

FIG. 10 is a view showing a relationship between the actual roughness distribution in the first region of a glass substrate for mask blanks on one edge side thereof, and the virtual roughness distribution in the second region thereof, in Examples 1-1, 1-2, 1-3, 1-4 and Comparative Example 1-1 (in Comparative Example 1-1, the latter distribution is the actual roughness distribution in the second region).

Figure 11:
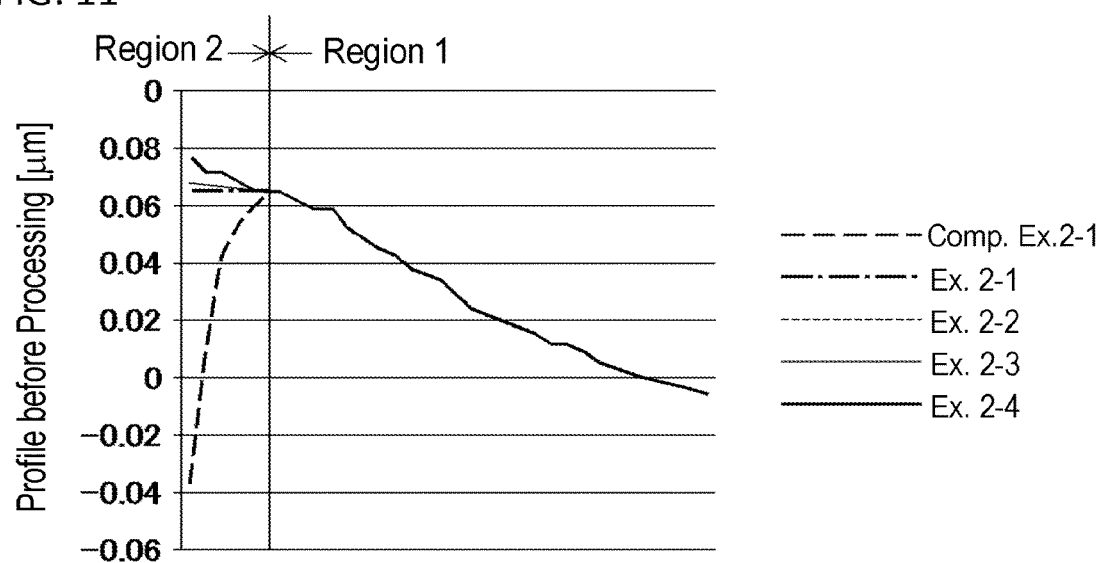
FIG. 11 is a view showing a relationship between an actual roughness distribution in a first region of a glass substrate for mask blanks and a virtual roughness distribution in a second region thereof in Examples 2-1 to 2-4 and Comparative Example 2-1 (in Comparative Example 2-1, the latter distribution is an actual roughness distribution in a second region).

FIG. 11 is a view showing a relationship between the actual roughness distribution in the first region of a glass substrate for mask blanks on one edge side thereof, and the virtual roughness distribution in the second region thereof, in Examples 2-1, 2-2, 2-3, 2-4 and Comparative Example 2-1 (in Comparative Example 2-1, the latter distribution is the actual roughness distribution in the second region).

Figure 12:
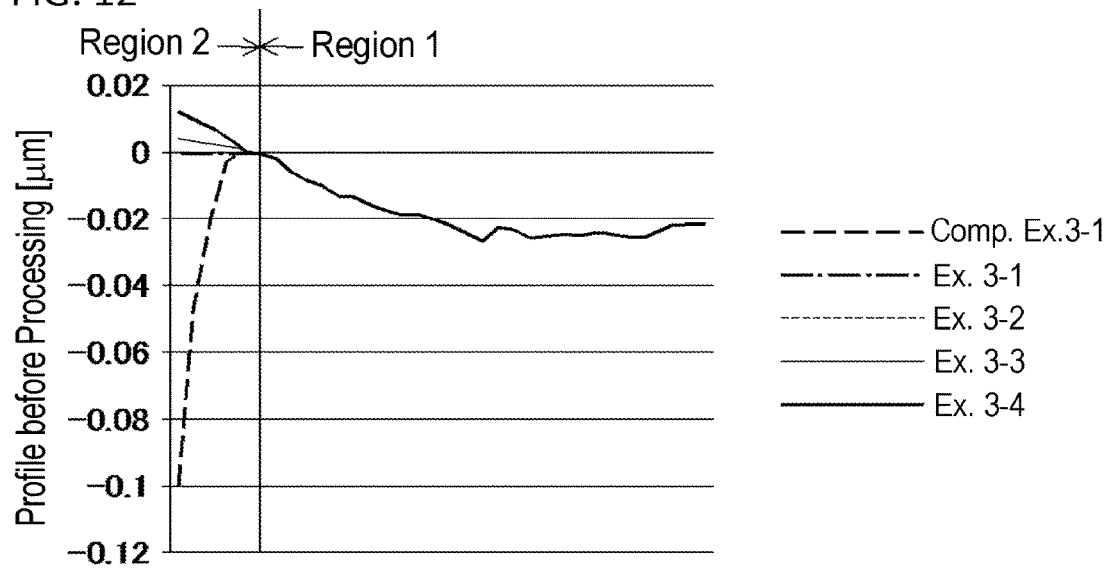
FIG. 12 is a view showing a relationship between an actual roughness distribution in a first region of a glass substrate for mask blanks and a virtual roughness distribution in a second region thereof in Examples 3-1 to 3-4 and Comparative Example 3-1 (in Comparative Example 3-1, the latter distribution is an actual roughness distribution in a second region).

FIG. 12 is a view showing a relationship between the actual roughness distribution in the first region of a glass substrate for mask blanks on one edge side thereof, and the virtual roughness distribution in the second region thereof, in Examples 3-1, 3-2, 3-3, 3-4 and Comparative Example 3-1 (in Comparative Example 3-1, the latter distribution is the actual roughness distribution in the second region).

Figure 13:
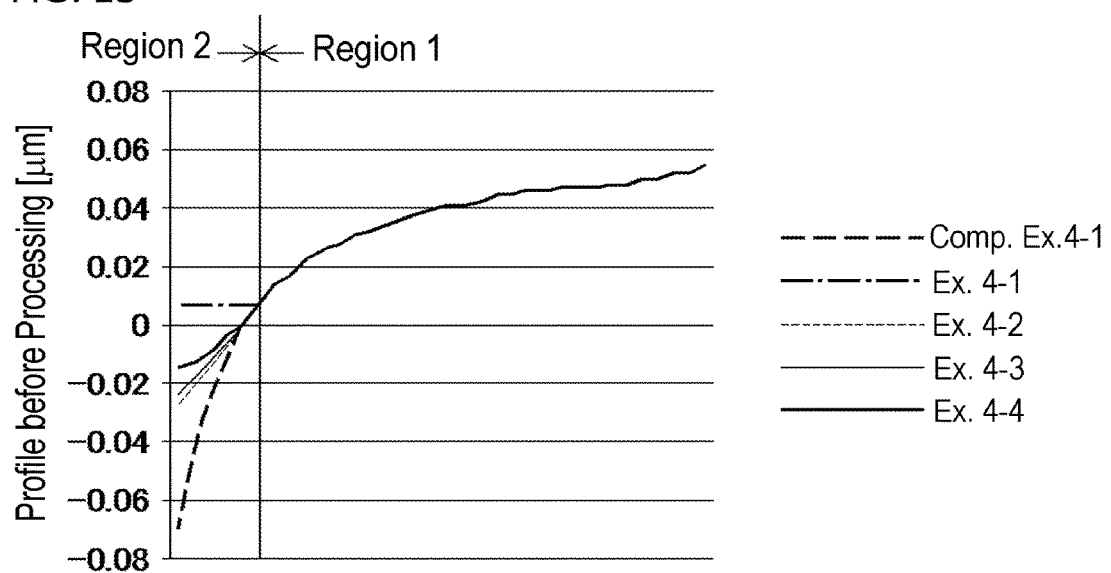
FIG. 13 is a view showing a relationship between an actual roughness distribution in a first region of a glass substrate for mask blanks and a virtual roughness distribution in a second region thereof in Examples 4-1 to 4-4 and Comparative Example 4-1 (in Comparative Example 4-1, the latter distribution is an actual roughness distribution in a second region).

FIG. 13 is a view showing a relationship between the actual roughness distribution in the first region of a glass substrate for mask blanks on one edge side thereof, and the virtual roughness distribution in the second region thereof, in Examples 4-1, 4-2, 4-3, 4-4 and Comparative Example 4-1 (in Comparative Example 4-1, the latter distribution is the actual roughness distribution in the second region).

FIG. 10 to FIG. 13 each shows a relationship between the actual roughness distribution in the first region of a glass substrate for mask blanks on one edge side thereof, and the virtual roughness distribution in the second region thereof (in Comparative Example 1-1 to Comparative Example 4-1, the latter distribution is the actual roughness distribution in the second region). The other edge side of the glass substrate for mask blanks also has the same relationship as above, when illustrated in the same manner.

(3) The first region and the second region of the main surface of the glass substrate for mask blanks are processed through GCIB etching, while the processing amount is controlled based on the actual roughness distribution in the first region obtained in the step of (1) and on the virtual roughness distribution in the second region obtained in the step of (2). The processing profile for GCIB etching to be used has a shape similar to a normal distribution with a standard deviation of 2.4 mm, and the half value radius in the processing profile is 2.8 mm. As the source gas, used is $SF_6$. The GCIB irradiation condition is so controlled that the etching volume in GCIB irradiation for 1 minute to the surface of the glass substrate at a given position could be 0.2 $mm^3$.

Figure 14:
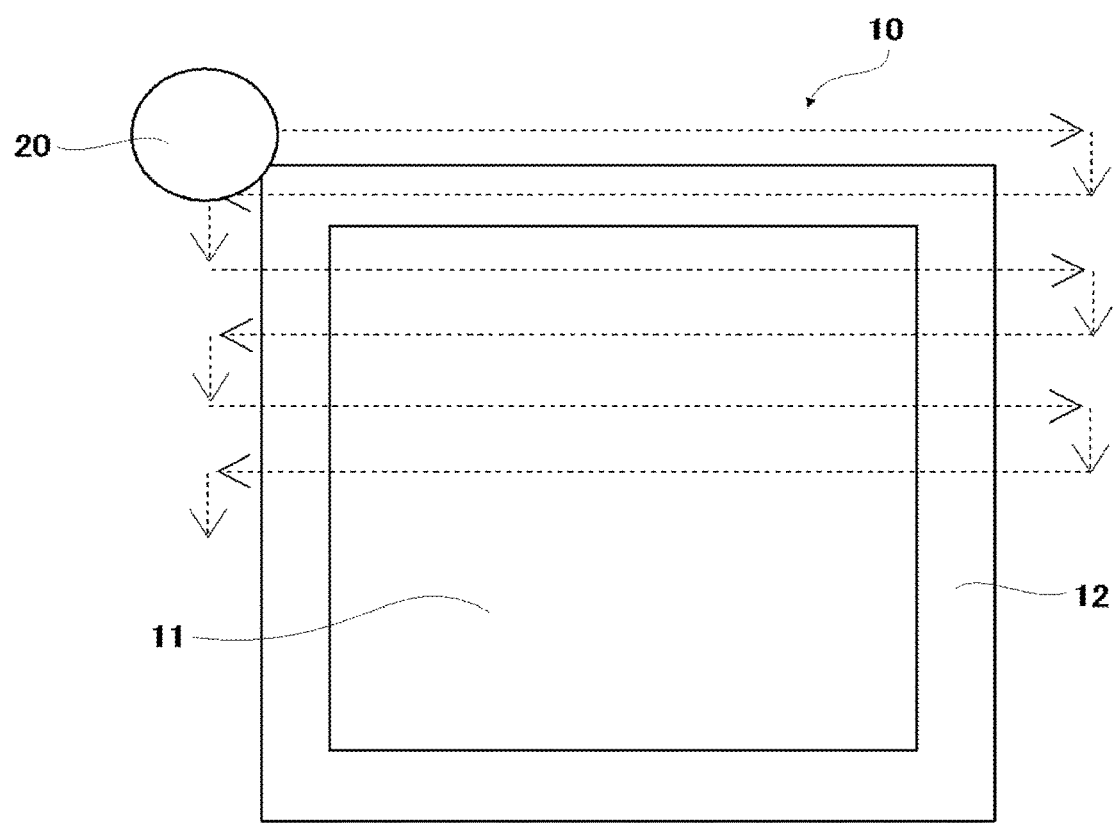
FIG. 14 is a view showing a scanning process for GCIB in Examples.

The scanning procedure of GCIB in Examples is shown in FIG. 14. As shown in FIG. 14, the beam center is moved in the direction parallel to one side of the glass substrate 10 for mask blanks, on the first region 11 and the second region 12 of the glass substrate 10 for mask blanks, up to the halfway point, and at the halfway point, this is moved by 0.5 mm in the direction perpendicular to that one side, and thereafter this is further moved in the direction opposite to the moving direction to the halfway point, and in the direction parallel to that one side, and this movement is repeated. The moving speed of the beam center is so changed as to be proportional to the reciprocal number of the desired processing amount at each position on the glass substrate 10 for mask blanks. The halfway point of the beam center is preferably outside the second region 12 of the glass substrate 10 for mask blanks, as shown in FIG. 14.

In each Example and Comparative Example, the processing time for the first region 11 and the processing error in the first region 11 are determined.

The processing time (unit: minute) for the first region 11 is calculated by dividing the working volume necessary for making the actual roughness profile of the first region 11 before processing and the virtual roughness distribution in the second region 12 in Example or the actual roughness distribution in the second region 12 in Comparative Example have an ideal shape, by 0.2 mm$^3$ that corresponds to the etching volume in GCIB irradiation for 1 minute to the surface of the glass substrate at a given position. However, at the position at which the processing amount is to be the smallest in the first region 11 and the second region 12, the substrate is processed to a depth of 50 nm.

The processing error in the first region 11 corresponds to the difference between the actual roughness distribution in the first region 11 after processing and the roughness distribution in the first region 11 in the ideal shape after processing, or that is, corresponds to the PV value. The processing error in the first region 11 is mainly the processing error in the vicinity of the boundary between the first region 11 and the second region 12, in the first region 11.

In Examples 1-1, 1-2, 1-3, 1-4 and Comparative Example 1-1, the processing time for the first region 11, and the processing error in the first region 11 are as shown in the following Table.

TABLE 1

|  | Processing Time for First Region 11 [min] | Processing Error in First Region 11 [nm] |
| --- | --- | --- |
| Example 1-1 | 13.6 | 22 |
| Example 1-2 | 15.8 | 30 |
| Example 1-3 | 15.4 | 28 |
| Example 1-4 | 13.6 | 24 |
| Comparative Example 1-1 | 26.8 | 56 |

The maximum value of the angle between the least square plane of each of the four rectangular regions 11b2 and the least square plane of the first region 11, the maximum value of the PV value relative to the least square plane of each region 11 of the four rectangular regions 11b2, the maximum value of the angle between the least square plane of each of the four square regions 11b1 and the least square plane of the first region 11, and the maximum value of the PV value relative to the least square plane of each region 11 of the four square regions 11b1 are as shown in the following Table.

TABLE 2

|  | Maximum Value of Angle of 11b2 [μrad] | Maximum Value of PV of 11b2 [nm] | Maximum Value of Angle of 11b1 [μrad] | Maximum Value of PV of 11b1 [nm] |
| --- | --- | --- | --- | --- |
| Example 1-1 | 0.06 | 11 | 0.12 | 22 |
| Example 1-2 | 1.25 | 12 | 2.80 | 27 |
| Example 1-3 | 1.16 | 12 | 2.54 | 26 |
| Example 1-4 | 0.60 | 9 | 1.39 | 21 |
| Comparative Example 1-1 | 2.69 | 25 | 5.69 | 53 |

Also in the other Examples and Comparative Examples, the processing time for the first region and the processing error in the first region are determined. In Examples 1-1, 2-1, 3-1 and 4-1, the processing time for the first region 11, and the mean value A of the processing error in the first region 11 are determined. In Examples 1-2, 2-2, 3-2 and 4-2, the processing time for the first region 11, and the mean value B of the processing error in the first region 11 are determined. In Examples 1-3, 2-3, 3-3 and 4-3, the processing time for the first region 11, and the mean value C of the processing error in the first region 11 are determined. In Examples 1-4, 2-4, 3-4 and 4-4, the processing time for the first region 11, and the mean value D of the processing error in the first region 11 are determined. In Comparative Examples 1-1, 2-1, 3-1 and 4-1, the processing time for the first region 11, and the mean value E of the processing error in the first region 11 are determined. The results are shown in the following Table.

TABLE 3

|  | Processing Time for First Region 11 [min] | Processing Error in First Region 11 [nm] |
| --- | --- | --- |
| Mean Value A | 19.8 | 19.5 |
| Mean Value B | 22.5 | 20 |
| Mean Value C | 22.2 | 19.5 |
| Mean Value D | 22.1 | 18.5 |
| Mean Value E | 30.3 | 42.5 |

The mean maximum value of the angle between the least square plane of each of the four rectangular regions 11b2 and the least square plane of the first region 11, the mean maximum value of the PV value relative to the least square plane of each region 11 of the four rectangular regions 11b2, the mean maximum value of the angle between the least square plane of each of the four square regions 11b1 and the least square plane of the first region 11, and the mean maximum value of the PV value relative to the least square plane of each region 11 of the four square regions 11b1 are as shown in the following Table.

TABLE 4

|  | Maximum Value of Angle of 11b2 [μrad] | Maximum Value of PV of 11b2 [nm] | Maximum Value of Angle of 11b1 [μrad] | Maximum Value of PV of 11b1 [nm] |
| --- | --- | --- | --- | --- |
| Mean Value A | 0.33 | 8 | 0.74 | 18 |
| Mean Value B | 0.67 | 7 | 1.60 | 17 |
| Mean Value C | 0.58 | 7 | 1.40 | 17 |
| Mean Value D | 0.30 | 6 | 0.76 | 15 |
| Mean Value E | 1.81 | 19 | 3.85 | 40 |

The mean values A to D of presetting the virtual roughness distribution in the second region mean that the processing time for the first region 11 is shortened as compared with the case of the mean value E using the actual roughness distribution in the second region, and means that the processing error in the first region 11 is thereby reduced, and in addition, the angle and the PV value relative to the least square plane of the first region 11 of the rectangular region 11b2 and the square region 11b1 are also reduced.

Reference Signs List

10: Glass Substrate for Mask Blank 11, 11a, 11b: First Region (Quality Assurance Region)

11b1: Square Region

11b2: Strip Region (Rectangular Region)

12: Second Region (Outside Region)

20: GCIB Irradiation Site

What is claimed is:

1. A glass substrate for a mask blank, having a rectangular planar shape, wherein when a least square plane of a surface of the glass substrate for a mask blank is defined as an X-Y plane and a quality assurance region of the surface of the glass substrate for a mask blank is defined as a first region, in four strip regions each positioned in an area between one side of the first region and 8 mm inside the side of the first region and excluding areas of 8 mm from both edges in a length direction of the side of the first region, an angle between a least square plane in each the strip region and a least square plane in the first region is 1.5 µrad or less, and a PV value inside each the strip region which is relative to the least square plane in the first region is 15 nm or less, and in four square regions each positioned in the first region and contacted with each corner of the first region and having one side of 8 mm, an angle between a least square plane in each the square region and the least square plane in the first region is 3.0 µrad or less, and a PV value inside each the square region which is relative to the least square plane in the first region is 30 nm or less.

2. A method for producing a glass substrate for a mask blank, comprising:
a surface profile measurement step of measuring a roughness profile in at least a first region in a surface of a glass substrate for a mask blank, where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region,
a corrected distribution calculation step of giving a virtual roughness distribution that differs from an actual roughness distribution in the second region, relative to the second region,
and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution in the second region obtained in the corrected distribution calculation step, wherein:
in a distance up to a half value radius in a processing profile per unit time of the local processing tool running toward a direction of the second region from a boundary between the first region and the second region, in a cross section parallel to a direction perpendicular to each side of the first region having a rectangular shape and in a cross section in a direction along an extending line from a diagonal line in the first region, the virtual roughness distribution is contained in a region between a straight line drawn by extending an inclination of the actual roughness distribution in the boundary toward a direction of the second region and a straight line drawn by extending toward the direction of the second region at an inclination of 0 from a maximum value of the actual roughness distribution in the distance up to the half value radius running toward a direction of the first region from the boundary between the first region and the second region when a straight line drawn by extending an inclination of the actual roughness distribution in the boundary toward the direction of the second region is downwardly inclined toward the second region or a minimum value of the actual roughness distribution in the distance up to the half value radius running toward the direction of the first region from the boundary between the first region and the second region when the straight line drawn by extending the inclination of the actual roughness distribution in the boundary toward the direction of the second region is upwardly inclined toward the second region.

3. A method for producing a glass substrate for a mask blank, comprising:
a surface profile measurement step of measuring a roughness profile in at least a first region in a surface of a glass substrate for a mask blank, where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region,
a corrected distribution calculation step of giving a virtual roughness distribution that differs from an actual roughness distribution in the second region, relative to the second region,
and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution in the second region obtained in the corrected distribution calculation step, wherein:
in a distance up to a half value radius in a processing profile per unit time of the local processing tool, running toward a direction of the second region from a boundary between the first region and the second region, in a cross section parallel to a direction perpendicular to each side of the first region having a rectangular shape and in a cross section in a direction along an extending line from a diagonal line in the first region, the virtual roughness distribution is contained in a region between a straight line drawn by extending the actual roughness distribution in the boundary between the first region and the second region toward the direction of the second region at an inclination of 0, and a straight line drawn by extending an inclination of the actual roughness distribution in the boundary toward the direction of the second direction.

4. A method for producing a glass substrate for a mask blank, comprising:
a surface profile measurement step of measuring a roughness profile in at least a first region in a surface of a glass substrate for a mask blank where a least square plane of the surface of the glass substrate for a mask blank, having a rectangular planar shape is defined as an X-Y plane, a quality assurance region of the surface of the glass substrate for a mask blank is defined as the first region, and a region of at least 2 mm outside the first region is defined as a second region,
a corrected distribution calculation step of giving a virtual roughness distribution that differs from an actual roughness distribution in the second region, relative to the second region,
and a processing step of processing the first region and second region of the surface of the glass substrate for a mask blank, using a local processing tool of which a unit processing area is smaller than an area of the first region, while controlling a processing amount based on an actual roughness distribution in the first region obtained in the surface profile measurement step and on the virtual roughness distribution obtained in the corrected distribution calculation step, wherein:

the virtual roughness distribution is given through point-symmetric movement of the actual roughness distribution in the first region in a distance up to a half value radius in a processing profile per unit time of the local processing tool, running toward a direction of the first region from a boundary between the first region and the second region in a cross section parallel to a direction perpendicular to each side of the first region having a rectangular shape and in a cross section in a direction along an extending line from a diagonal line in the first region, in the second region around the boundary as a symmetry center.

5. The method for producing a glass substrate for a mask blank according to claim 2, wherein the local processing tool uses, as a processing method, at least one selected from the group consisting of an ion beam etching method, a gas cluster ion beam (GCIB) etching method, a plasma etching method, a wet etching method, a polishing method using a magnetic fluid, and a polishing method using a rotary small-size processing tool.

6. The method for producing a glass substrate for a mask blank according to claim 3, wherein the local processing tool uses, as a processing method, at least one selected from the group consisting of an ion beam etching method, a gas cluster ion beam (GCIB) etching method, a plasma etching method, a wet etching method, a polishing method using a magnetic fluid, and a polishing method using a rotary small-size processing tool.

7. The method for producing a glass substrate for a mask blank according to claim 4, wherein the local processing tool uses, as a processing method, at least one selected from the group consisting of an ion beam etching method, a gas cluster ion beam (GCIB) etching method, a plasma etching method, a wet etching method, a polishing method using a magnetic fluid, and a polishing method using a rotary small-size processing tool.

8. The method for producing a glass substrate for a mask blank according to claim 2, wherein the glass substrate for a mask blank before subjected to the surface profile measurement step is pre-polished so that a flatness (PV value) in at least the first region in the surface of the glass substrate for a mask blank is 0.5 µm or less.

9. The method for producing a glass substrate for a mask blank according to claim 3, wherein the glass substrate for a mask blank before subjected to the surface profile measurement step is pre-polished so that a flatness (PV value) in at least the first region in the surface of the glass substrate for a mask blank is 0.5 µm or less.

10. The method for producing a glass substrate for a mask blank according to claim 4, wherein the glass substrate for a mask blank before subjected to the surface profile measurement step is pre-polished so that a flatness (PV value) in at least the first region in the surface of the glass substrate for a mask blank is 0.5 µm or less.

11. The method for producing a glass substrate for a mask blank according to claim 5, wherein the glass substrate for a mask blank before subjected to the surface profile measurement step is pre-polished so that a flatness (PV value) in at least the first region in the surface of the glass substrate for a mask blank is 0.5 µm or less.

12. The method for producing a glass substrate for a mask blank according to claim 6, wherein the glass substrate for a mask blank before subjected to the surface profile measurement step is pre-polished so that a flatness (PV value) in at least the first region in the surface of the glass substrate for a mask blank is 0.5 µm or less.

13. The method for producing a glass substrate for a mask blank according to claim 7, wherein the glass substrate for a mask blank before subjected to the surface profile measurement step is pre-polished so that a flatness (PV value) in at least the first region in the surface of the glass substrate for a mask blank is 0.5 µm or less.

* * * * *